US012638502B2

(12) United States Patent
Miyoshi et al.

(10) Patent No.: US 12,638,502 B2
(45) Date of Patent: May 26, 2026

(54) SEMICONDUCTOR INTEGRATED CIRCUIT DEVICE AND EVALUATION SYSTEM

(71) Applicant: ROHM Co., LTD., Kyoto (JP)

(72) Inventors: Hideki Miyoshi, Kyoto (JP); Akira Uryu, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 18/607,764

(22) Filed: Mar. 18, 2024

(65) Prior Publication Data

US 2024/0319271 A1 Sep. 26, 2024

(30) Foreign Application Priority Data

Mar. 20, 2023 (JP) ................................. 2023-043989

(51) Int. Cl.
*G01R 31/3183* (2006.01)
*G01R 29/26* (2006.01)
*G01R 31/3193* (2006.01)

(52) U.S. Cl.
CPC ..... *G01R 31/318385* (2013.01); *G01R 29/26* (2013.01); *G01R 31/3193* (2013.01)

(58) Field of Classification Search
CPC ............ G01R 31/318385; G01R 29/26; G01R 31/3193; H03K 3/84
See application file for complete search history.

(56) References Cited

U.S. PATENT DOCUMENTS

| | | | | |
|---|---|---|---|---|
| 4,384,354 A | * | 5/1983 | Crawford | H04L 1/24 |
| | | | | 702/180 |
| 6,594,680 B1 | * | 7/2003 | Gu | G06F 7/584 |
| | | | | 708/252 |
| 6,910,165 B2 | * | 6/2005 | Chen | G01R 31/2841 |
| | | | | 714/739 |
| 11,774,496 B2 | * | 10/2023 | Sakare | G01R 31/3177 |
| | | | | 714/731 |
| 2008/0178055 A1 | * | 7/2008 | Nakamura | G01R 31/31813 |
| | | | | 714/739 |
| 2020/0235735 A1 | * | 7/2020 | Plusquellic | H04L 9/0662 |

FOREIGN PATENT DOCUMENTS

JP 2014-51904 A 3/2014

OTHER PUBLICATIONS

J. A. Tofte, Chee-Kian Ong, Jiun-Lang Huang and Kwang-Ting Cheng, "Characterization of a pseudo-random testing technique for analog and mixed-signal built-in-self-test," Proceedings 18th IEEE VLSI Test Symposium, Montreal, QC, Canada, 2000, pp. 237-246 (Year: 2000).*

* cited by examiner

*Primary Examiner* — Cynthia Britt
(74) *Attorney, Agent, or Firm* — CHIP Law Group

(57) ABSTRACT

Provided is a semiconductor integrated circuit device including a pseudo-random pattern generator configured to output a pseudo-random pattern, a terminal for externally outputting an output of the pseudo-random pattern generator or an evaluation result of noise tolerance evaluated on the basis of the pseudo-random pattern.

8 Claims, 5 Drawing Sheets

SEMICONDUCTOR INTEGRATED CIRCUIT DEVICE AND EVALUATION SYSTEM

CROSS REFERENCE TO RELATED APPLICATIONS

This application claims priority benefit of Japanese Patent Application No. JP 2023-043989 filed in the Japan Patent Office on Mar. 20, 2023. Each of the above-referenced applications is hereby incorporated herein by reference in its entirety.

BACKGROUND

The present disclosure relates to a semiconductor integrated circuit device and an evaluation system.

In the past, various semiconductor integrated circuit devices having high noise tolerance (=malfunction tolerance against noise) have been developed (for example, see JP 2014-51904A).

DETAILED DESCRIPTION

First Embodiment

Figure 1:
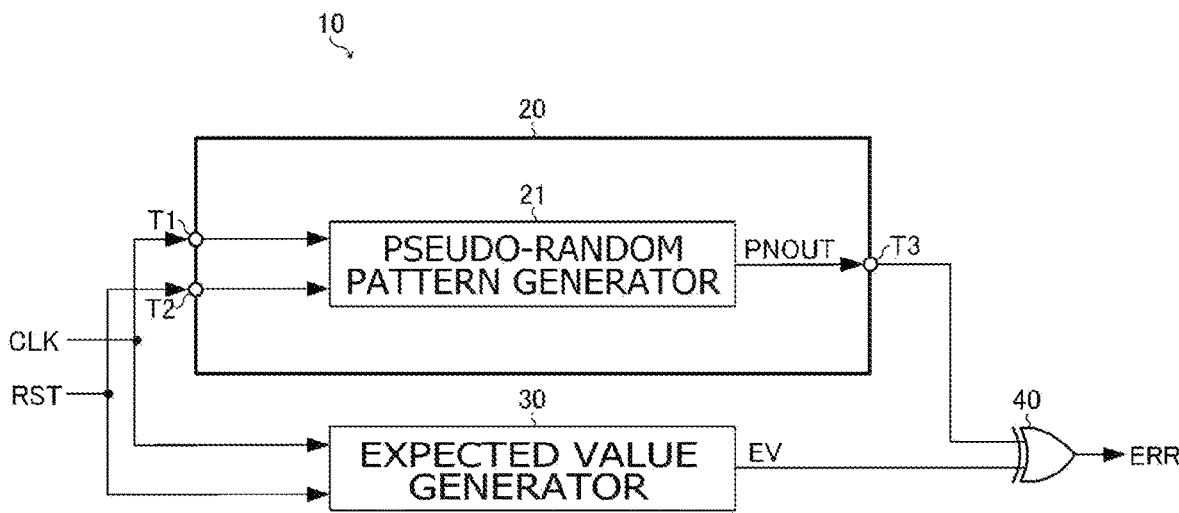
FIG. 1 is a diagram illustrating a schematic configuration of an evaluation system according to a first embodiment.

FIG. 1 is a diagram illustrating a schematic configuration of an evaluation system according to the first embodiment. An evaluation system 10 includes a semiconductor integrated circuit device 20. The evaluation system 10 is a system that can evaluate noise tolerance of the semiconductor integrated circuit device 20.

The semiconductor integrated circuit device 20 includes terminals T1 to T3 and a pseudo-random pattern generator 21. The semiconductor integrated circuit device 20 may be a semiconductor integrated circuit device for any purpose, and may be a power supply integrated circuit (IC) equipped with a single DC/DC converter, for example, or may be a power management IC equipped with a plurality of power supply circuits, for example.

Terminal T1 is a terminal for receiving a clock signal CLK from an outside of the semiconductor integrated circuit device 20.

Terminal T2 is a terminal for receiving a reset signal RST from the outside of the semiconductor integrated circuit device 20.

Terminal T3 is a terminal for supplying a pseudo-random pattern PNOUT to the outside of the semiconductor integrated circuit device 20.

The pseudo-random pattern generator 21 outputs the pseudo-random pattern PNOUT. The pseudo-random pattern generator 21 operates based on the clock signal CLK. Furthermore, the pseudo-random pattern generator 21 resets (initializes) the pseudo-random pattern PNOUT in response to the reset signal RST.

Figure 2:
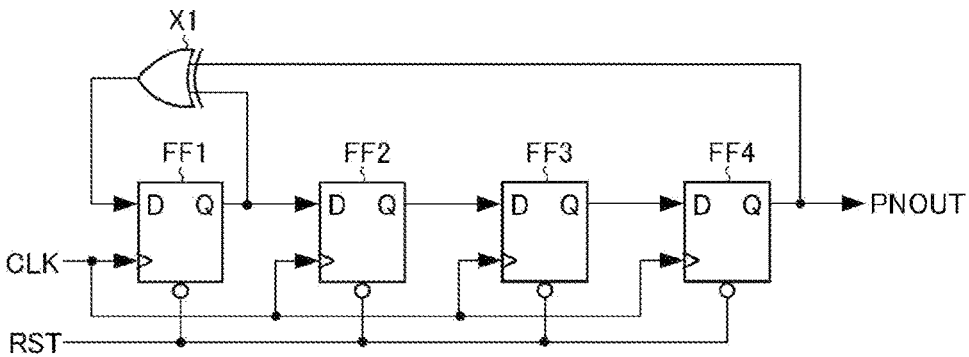
FIG. 2 is a diagram illustrating a configuration example of a pseudo-random pattern generator.

As illustrated in FIG. 2, for example, the pseudo-random pattern generator 21 includes a shift register constituted by a plurality of flip-flops FF1 to FF4 and an exclusive OR gate X1 that calculates the exclusive OR of an intermediate output and the final output of the shift register and feeds back the exclusive OR to the first stage of the shift register. The number of stages of the shift register, namely, the number of flip-flops, is not particularly limited, but it is preferable to set the number of flip-flops according to the number of locations where the noise tolerance is desired to be evaluated. In the case of a general semiconductor integrated circuit device, the number of flip-flops is preferably set in a range of approximately 4 to 9.

The pseudo-random pattern PNOUT has such a property as to be synchronized in long cycles (when all bits are 1 or all bits are 0), and have randomness in short cycles (several cycles of the clock signal CLK).

When the pseudo-random pattern generator 21 malfunctions due to noise, a disturbance occurs in the pseudo-random pattern PNOUT. The evaluation system 10 uses this pseudo-random pattern PNOUT to evaluate the noise tolerance of the semiconductor integrated circuit device 20.

Figure 3:
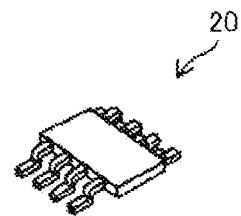
FIG. 3 is an external perspective view of a semiconductor integrated circuit device.

FIG. 3 is an external perspective view of the semiconductor integrated circuit device 20. The semiconductor integrated circuit device 20 is an electronic component formed by enclosing a semiconductor integrated circuit chip in a housing (package) made of resin. A plurality of external terminals are provided so as to be exposed on the housing of the semiconductor integrated circuit device 20, and the plurality of external terminals include terminals T1 to T3 illustrated in FIG. 1. Note that the number of external terminals of the semiconductor integrated circuit device 20 and the external appearance of the semiconductor integrated circuit device 20 illustrated in FIG. 3 are merely examples.

As illustrated in FIG. 1, the evaluation system 10 includes an expected value generator 30 and a detector 40 in addition to the semiconductor integrated circuit device 20.

The expected value generator 30 outputs an expected value EV of the pseudo-random pattern PNOUT described above. The expected value generator 30 has the same circuit configuration as the pseudo-random pattern generator 21. The pseudo-random pattern generator 21 and the expected value generator 30 are synchronized on the basis of the same clock signal CLK. Further, the pseudo-random pattern generator 21 and the expected value generator 30 are reset (initialized) on the basis of the same reset signal RST. Therefore, the expected value generator 30 can easily generate the expected value EV of the pseudo-random pattern PNOUT described above.

The detector 40 detects a mismatch between the pseudo-random pattern PNOUT which is the output of the pseudo-random pattern generator 21 and the expected value EV of the pseudo-random pattern PNOUT, which is the output of the expected value generator 30. In the example of the present embodiment, the detector 40 is an exclusive OR gate, and sets the value of an output signal ERR to 1 when the output of the pseudo-random pattern generator 21 and the output of the expected value generator 30 do not match, and sets the value of the output signal ERR to 0 when the output of the pseudo-random pattern generator 21 and the output of the expected value generator 30 match.

When the value of the output signal ERR of the detector 40 becomes 1, it becomes clear that the pseudo-random pattern generator 21 is malfunctioning due to noise. Therefore, the noise tolerance of the semiconductor integrated circuit device 20 can be evaluated by applying various types of disturbances to the semiconductor integrated circuit device 20 and checking whether the value of the output signal ERR of the detector 40 becomes 1. Regarding the various types of disturbances, for example, adding noise to the power supply voltage supplied to the semiconductor integrated circuit device 20, adding noise to the ground voltage supplied to the semiconductor integrated circuit device 20, causing the load on the semiconductor integrated circuit device 20 to fluctuate sharply, generating an aerial discharge at the periphery of the semiconductor integrated circuit device 20 can be considered.

The time difference between the timing at which the pseudo-random pattern generator 21 malfunctions due to noise and the timing at which the value of the output signal ERR of the detector 40 becomes 1 is only the elapsed time until the erroneous data output of the flip-flop is output to the outside by shifting. Therefore, the evaluation system 10 can grasp in almost real time when a malfunction due to noise occurs in the semiconductor integrated circuit device 20, more specifically, in the pseudo-random pattern generator 21.

Furthermore, by dispersedly arranging a plurality of flip-flops that are components of the pseudo-random pattern generator 21, where malfunctions due to noise occur in the semiconductor integrated circuit chip can also be identified.

Figure 4:
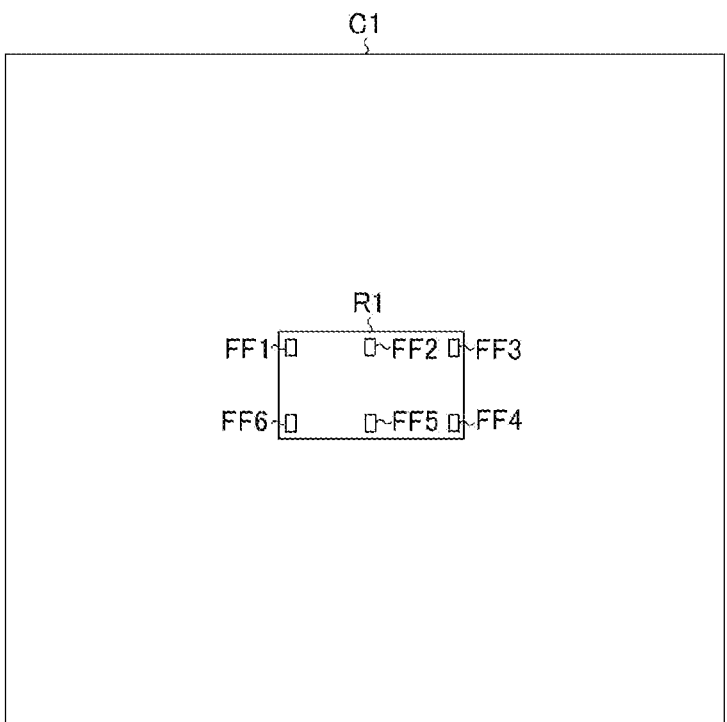
FIG. 4 is a schematic top view of a semiconductor integrated circuit chip.
Figure 5:
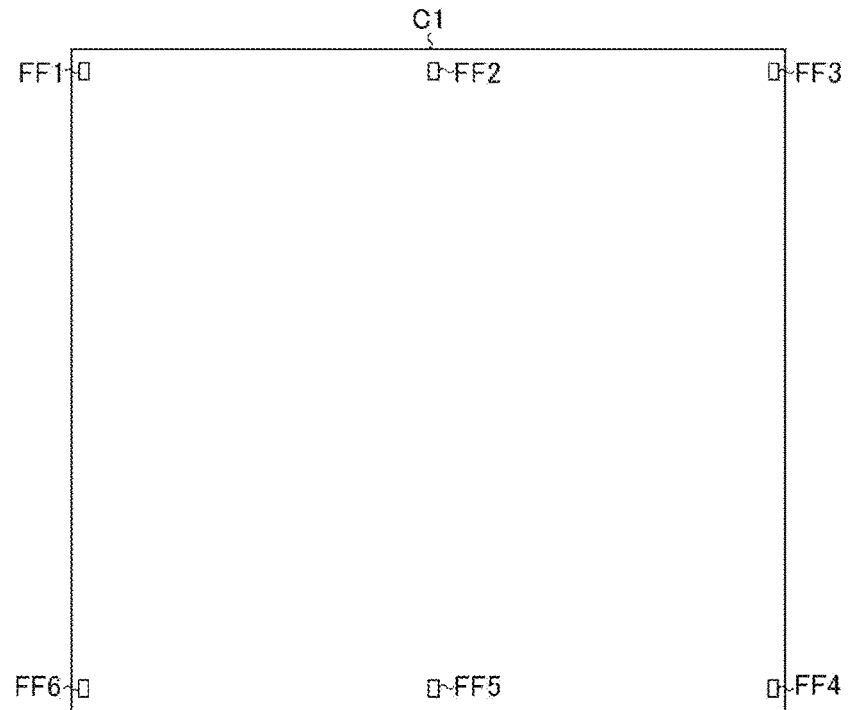
FIG. 5 is another schematic top view of the semiconductor integrated circuit chip.

As an example of the arrangement of flip-flops, as illustrated in FIG. 4, a pseudo-random pattern generator 21 is arranged in the specific region R1 of a semiconductor integrated circuit chip C1, and a plurality of flip-flops FF1 to FF6 are dispersedly arranged in the region R1. Further, as another example of the arrangement of flip-flops, as illustrated in FIG. 5, the plurality of flip-flops FF1 to FF6 are dispersedly arranged throughout the entire semiconductor integrated circuit chip C1. Note that, in the examples illustrated in FIGS. 4 and 5, the number of flip-flops that are components of the pseudo-random pattern generator 21 is set to six. Further, FIGS. 4 and 5 are schematic top views of the semiconductor integrated circuit chip C1.

Second Embodiment

Figure 6:
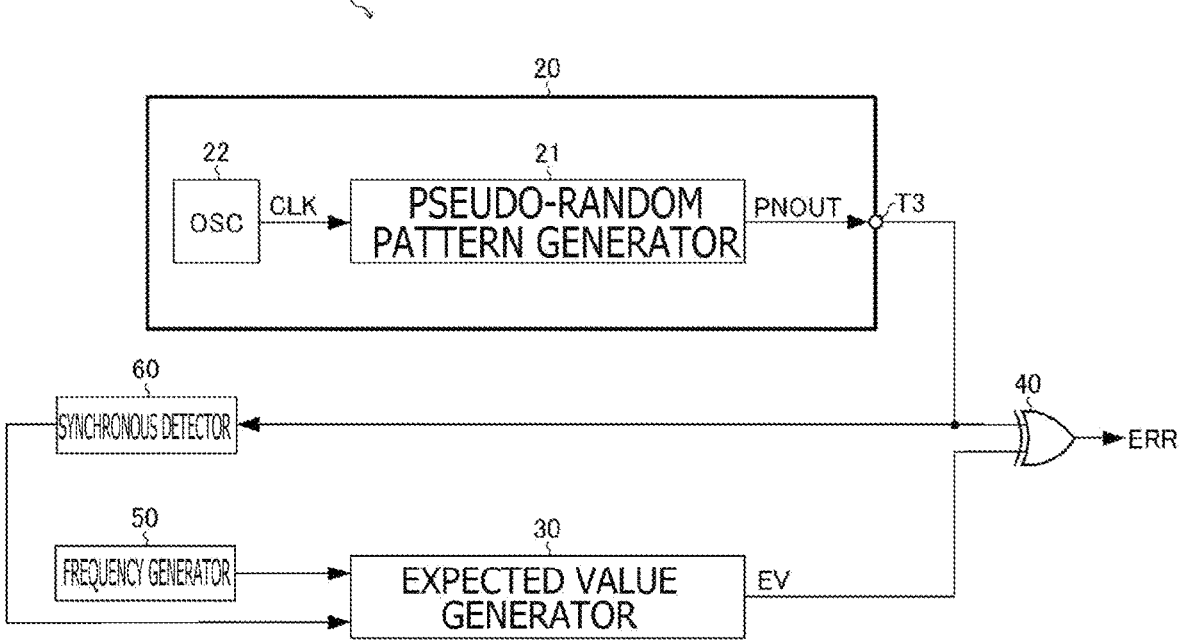
FIG. 6 is a diagram illustrating a schematic configuration of an evaluation system according to a second embodiment.

FIG. 6 is a diagram illustrating a schematic configuration of an evaluation system according to the second embodiment. The evaluation system 10 illustrated in FIG. 6 includes the semiconductor integrated circuit device 20, the expected value generator 30, the detector 40, a frequency generator 50, and a synchronous detector 60.

In the present embodiment, the semiconductor integrated circuit device 20 does not include terminals T1 and T2. In the present embodiment, the semiconductor integrated circuit device 20 includes an oscillator 22 that outputs the clock signal CLK.

The frequency generator 50 adjusts the operating frequency of the expected value generator 30. To be specific, after the synchronous detector 60 has established synchronism, the frequency generator 50 adjusts the operating frequency of the expected value generator 30 such that the value of the output signal ERR of the detector 40 becomes 0 without disturbance.

The synchronous detector 60 detects a synchronization point (a point where all bits become 1 or a point where all bits become 0) in a long cycle of the pseudo-random pattern PNOUT, and resets (initializes) the expected value generator 30 at the synchronization point.

In the present embodiment as well, after the frequency generator 50 finishes adjusting the operating frequency of the expected value generator 30, the evaluation system 10 can perform an evaluation regarding the noise tolerance of the semiconductor integrated circuit device 20, as in the first embodiment.

Third Embodiment

Figure 7:
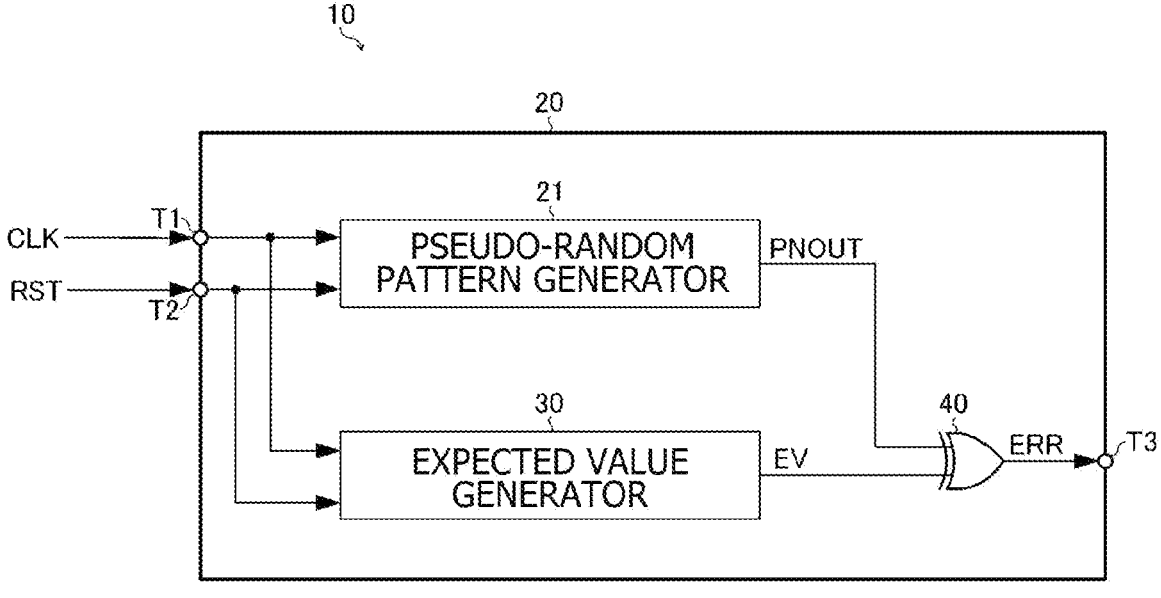
FIG. 7 is a diagram illustrating a schematic configuration of an evaluation system according to a third embodiment.

FIG. 7 is a diagram illustrating a schematic configuration of an evaluation system according to the third embodiment. The evaluation system 10 illustrated in FIG. 7 is configured by a single semiconductor integrated circuit device 20.

In the present embodiment, the semiconductor integrated circuit device 20 has the expected value generator 30 and the detector 40 inside. Terminal T3 is used to output the output signal ERR of the detector 40, which is the evaluation result of the noise tolerance evaluated on the basis of the pseudo-random pattern PNOUT, to the outside of the semiconductor integrated circuit device 20.

Figure 8:
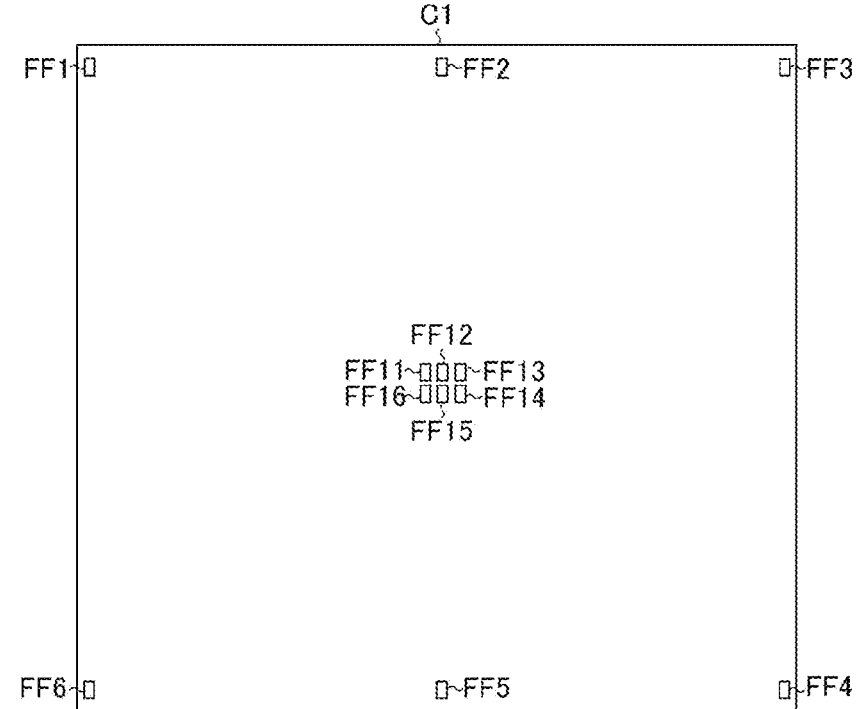
FIG. 8 is still another schematic top view of the semiconductor integrated circuit chip.

As an example of the arrangement of flip-flops, as illustrated in FIG. 8, the plurality of flip-flops FF1 to FF6 constituting the pseudo-random pattern generator 21 are dispersedly arranged throughout the entire semiconductor integrated circuit chip C1, and a plurality of flip-flops FF11 to FF16 constituting the expected value generator 30 are arranged centrally. The flip-flops FF11 to FF16 are preferably placed in locations where the flip-flops are less affected by noise than the flip-flops FF1 to FF6. In the examples illustrated in FIGS. 4 and 5, the number of flip-flops that are components of the pseudo-random pattern generator 21 is set to six, and the number of flip-flops that are components of the expected value generator 30 is also set to six. Further, FIG. 8 is a schematic top view of the semiconductor integrated circuit chip C1.

Even if the expected value generator 30 malfunctions due to noise, when the malfunction of the pseudo-random pattern generator 21 due to noise and the malfunction of the expected value generator 30 due to noise have different behavior from each other, the evaluation system 10 illustrated in FIG. 6 can detect the malfunction due to noise.

In the example illustrated in FIG. 7, the semiconductor integrated circuit device 20 is configured to receive the clock signal CLK and the reset signal RST from the outside, but the semiconductor integrated circuit device 20 may be configured to generate at least one of the clock signal CLK and the reset signal RST internally.

Fourth Embodiment

Figure 9:
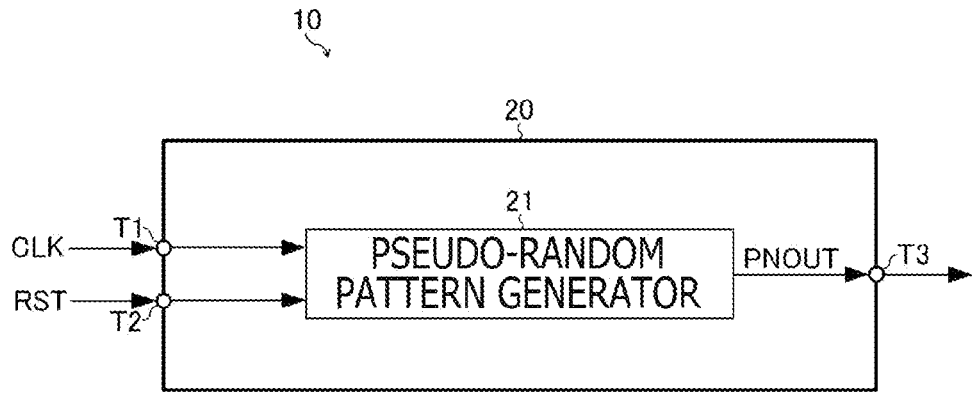
FIG. 9 is a diagram illustrating a schematic configuration of an evaluation system according to a fourth embodiment.

FIG. 9 is a diagram illustrating a schematic configuration of an evaluation system according to the fourth embodiment. The evaluation system 10 illustrated in FIG. 9 is constituted by a single semiconductor integrated circuit device 20 having the same configuration as the semiconductor integrated circuit device 20 used in the first embodiment.

When the pseudo-random pattern generator 21 malfunctions due to noise, the long cycle of the pseudo-random pattern PNOUT is disturbed by the malfunction. Therefore, for example, by displaying the waveform of the pseudo-random pattern PNOUT externally output from terminal T3 on an oscilloscope and visually checking the long cycle of the pseudo-random pattern PNOUT, the evaluating person can easily understand whether malfunctions have occurred due to noise.

Moreover, automatic determination becomes possible by providing a determination unit that determines whether or not the output of a counter that counts the long cycle of the pseudo-random pattern PNOUT and the pseudo-random pattern PNOUT synchronize with each other.

(Others)

In addition to the above-described embodiments, the configuration of the disclosure can be modified in various ways without departing from the spirit of the disclosure. The above embodiments should be considered to be illustrative in all respects and not restrictive, and the technical scope of the present disclosure is indicated by the claims rather than the description of the above embodiments, and it should be understood that all changes that belong to the meaning and range of equivalence of the claims are included.

Figure 10:
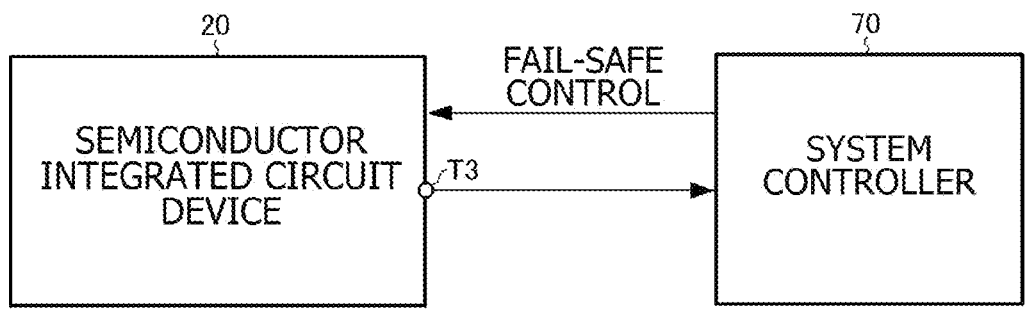
FIG. 10 is a diagram illustrating a schematic configuration of a system that performs fail-safe control.

For example, the signal output from terminal T3 of the semiconductor integrated circuit device 20 may be used for fail-safe control. As illustrated in FIG. 10, a system controller 70 determines whether or not the noise tolerance of the semiconductor integrated circuit device 20 is within an allowable range on the basis of the signal output from terminal T3 of the semiconductor integrated circuit device 20. When the noise tolerance of the semiconductor integrated circuit device 20 is outside the allowable range, the system controller 70 controls the semiconductor integrated circuit device 20 in a safe direction (for example, termination of the operation).

Alternatively, the pseudo-random pattern generator 21 may be more likely to malfunction due to noise by purposely configuring the circuit such that the noise tolerance of the pseudo-random pattern generator 21 is lowered.

For example, a flip-flop that is a component of the pseudo-random pattern generator 21 may be placed near a noise source (for example, a switching element, an oscillator, etc.) inside the semiconductor integrated circuit device 20.

Further, for example, a composite cell may be provided between a plurality of flip-flops that are components of the pseudo-random pattern generator 21. The composite cell is a logic circuit block that includes a plurality of logic cells and has a higher threshold voltage than a single logic cell.

Furthermore, for example, an antenna diode may be provided between the input terminal of a flip-flop that is a component of the pseudo-random pattern generator 21 and a ground line or a power supply line.

Further, for example, wiring between a plurality of flip-flops that are components of the pseudo-random pattern generator 21 may be arranged so as to surround a noise source (for example, a switching element, an oscillator, etc.) inside the semiconductor integrated circuit device 20.

(Supplementary Notes)

Supplementary notes are provided regarding the present disclosure, in which specific configuration examples are described in the above-described embodiments.

A semiconductor integrated circuit device (20) according to the present disclosure has a configuration (a first configuration) including a pseudo-random pattern generator (21) configured to output a pseudo-random pattern, a terminal (T3) for externally outputting an output of the pseudo-random pattern generator or an evaluation result of noise tolerance evaluated on the basis of the pseudo-random pattern.

The semiconductor integrated circuit device according to the first configuration above may have a configuration (a second configuration) including a noise source, in which a flip-flop that is a component of the pseudo-random pattern generator is arranged near the noise source.

The semiconductor integrated circuit device according to the first configuration or the second configuration above may have a configuration (a third configuration) including a composite cell provided between a plurality of flip-flops that are components of the pseudo-random pattern generator.

The semiconductor integrated circuit device according to any one of the first configuration to the third configuration above may have a configuration (a fourth configuration) including an antenna diode provided between an input terminal of a flip-flop that is a component of the pseudo-random pattern generator and a ground line or a power supply line.

The semiconductor integrated circuit device according to any one of the first configuration to the fourth configuration above may have a configuration (a fifth configuration) including a noise source, in which wiring between a plurality of flip-flops that are components of the pseudo-random pattern generator is arranged so as to surround the noise source.

An evaluation system (10) according to the present disclosure has a configuration (a sixth configuration) including the semiconductor integrated circuit device (20) according to any one of the first configuration to the fifth configuration, an expected value generator (30) configured to output an expected value of the pseudo-random pattern, and a detector (40) configured to detect a mismatch between the output of the pseudo-random pattern generator and an output of the expected value generator.

The evaluation system according to the sixth configuration above may have a configuration (a seventh configuration), in which the pseudo-random pattern generator and the expected value generator are synchronized on the basis of an identical clock signal.

The evaluation system according to the sixth configuration above may have a configuration (an eighth configuration) including a frequency generator (50) configured to adjust an operating frequency of the expected value generator, in which the expected value generator is provided outside the semiconductor integrated circuit device, and is configured to set an initial value on the basis of the output of the pseudo-random pattern generator.

According to the disclosure disclosed herein, information useful for evaluating noise tolerance can be provided.

What is claimed is:

1. A semiconductor integrated circuit device comprising:
   a pseudo-random pattern generator configured to output an output of the pseudo-random pattern generator; and
   a terminal configured to externally output an evaluation result of noise tolerance, wherein
   the evaluation result of noise tolerance is evaluated on a basis of the output of the pseudo-random pattern generator, and
   the output of the pseudo-random pattern generator is synchronized during a first period and has a random feature during a second period shorter than the first period.

2. The semiconductor integrated circuit device according to claim 1, further comprising:

a noise source, wherein a wiring between flip-flops, that are components of the pseudo-random pattern generator, surrounds the noise source.

3. An evaluation system comprising:

the semiconductor integrated circuit device according to claim 1;

an expected value generator configured to output an expected value of the output of the pseudo-random pattern generator; and a detector configured to detect a mismatch between the output of the pseudo-random pattern generator and an output of the expected value generator.

4. The evaluation system according to claim 3, wherein the pseudo-random pattern generator and the expected value generator are synchronized on a basis of an identical clock signal.

5. The evaluation system according to claim 3, further comprising:

a frequency generator configured to adjust an operating frequency of the expected value generator, wherein the expected value generator is configured to set an initial value on a basis of the output of the pseudo-random pattern generator.

6. The evaluation system according to claim 3, wherein the expected value generator has a circuit configuration same as a circuit configuration of the pseudo-random pattern generator.

7. The semiconductor integrated circuit device according to claim 1, wherein the pseudo-random pattern generator is further configured to:

receive a reset signal; and reset the output of the pseudo-random pattern generator based on the received reset signal.

8. The semiconductor integrated circuit device according to claim 1, wherein the first period is a period from a first time instant to a second time instant, all of bits of the output of the pseudo-random pattern generator becomes a same logical value from the first time instant to the second time instant, and the second period is one or more clock periods generated shorter than the first period.

\* \* \* \* \*